US011856807B2

(12) United States Patent
Suto et al.

(10) Patent No.: US 11,856,807 B2
(45) Date of Patent: *Dec. 26, 2023

(54) METHOD FOR PRODUCING LAMINATE AND METHOD FOR PRODUCING PEROVSKITE SOLAR CELL

(71) Applicant: JFE Steel Corporation, Tokyo (JP)

(72) Inventors: Mikito Suto, Tokyo (JP); Hiroyuki Masuoka, Tokyo (JP); Akira Matsuzaki, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/297,160

(22) PCT Filed: Dec. 9, 2019

(86) PCT No.: PCT/JP2019/047996
§ 371 (c)(1),
(2) Date: May 26, 2021

(87) PCT Pub. No.: WO2020/121991
PCT Pub. Date: Jun. 18, 2020

(65) Prior Publication Data
US 2022/0029117 A1   Jan. 27, 2022

(30) Foreign Application Priority Data
Dec. 12, 2018 (JP) ................... 2018-232670

(51) Int. Cl.
| H01L 25/00 | (2006.01) |
| H01L 31/00 | (2006.01) |
| H02S 10/00 | (2014.01) |
| H10K 30/88 | (2023.01) |
| H10K 30/10 | (2023.01) |
| H10K 30/82 | (2023.01) |

(52) U.S. Cl.
CPC ............ *H10K 30/88* (2023.02); *H10K 30/10* (2023.02); *H10K 30/82* (2023.02)

(58) Field of Classification Search
CPC . H01L 51/448; H01L 51/4213; H01L 51/442; H01L 51/0002; H01L 51/4226; H01L 51/44; H01L 51/0007; Y02E 10/542; Y02E 10/549; H01G 9/2031; Y02P 70/50; C01G 23/04
See application file for complete search history.

(56) References Cited

U.S. PATENT DOCUMENTS

| 10,069,025 B2 | 9/2018 | Snaith et al. |
| 2010/0290974 A1 | 11/2010 | Hu et al. |
| 2013/0327386 A1 | 12/2013 | Xu |
| 2015/0249170 A1* | 9/2015 | Snaith et al. ....... H01L 31/1884 136/265 |
| 2020/0131645 A1 | 4/2020 | Suto et al. |

FOREIGN PATENT DOCUMENTS

| CN | 104769736 A | 7/2015 | |
| JP | 2015056430 A | 3/2015 | |
| JP | 2015535390 A * | 12/2015 | ..... H01L 31/022466 |
| JP | 2015535390 A | 12/2015 | |
| JP | 2017082295 A | 5/2017 | |
| TW | 201537759 A | 10/2015 | |
| WO | 2018225861 A1 | 12/2018 | |

OTHER PUBLICATIONS

Chigane ("Preparation of Hollow Titanium Dioxide Shell Thin Films by Electrophoresis and Electrolysis for Dye-Sensitized Solar Cells") , Electrochemical and Solid-State Letters, 12 5 E5-E8 2009 (Year: 2009).*
Chigane-2 ("Titanium dioxide thin films prepared by electrolysis from aqueous solution of titanium-lactic aced complex for dye-sensitized solar cells"), Thin Solid Films 520 (2012) 3510-3514 (Year: 2012).*
Lokhande ("Cathodic electrodeposition of amorphous titanium oxide films from an alkaline solution bath"). Journal of Materials Science 40 (2005) 491-494 (Year: 2005).*
Ishizaki ("Electrochemical Fabrication of Titanium Oxide Film from an Aqueous Solution Containing Titanium Ion and Hydroxylamine") 2011 ECS Trans. 41 111 (Year: 2011).*
Karuppuchamy ("A novel one-step electrochemical method to obtain crystalline titanium dioxide films at low temperature"). Current Applied Physics vol. 9, Issue 1, Jan. 2009, pp. 243-248 (Year: 2009).*
Ko et al., "Electrodeposition of SnO2 on FTO and its Application In Planar Heterojunction Perovskite Solar Cells as an Electron Transport Layer", Nanoscale Research Letters, vol. 12(1), Aug. 16, 2017, 7 pages.
Su et al., "Electrodeposited Ultrathin $TiO_2$ Blocking Layers for Efficient Perovskite Solar Cells", Scientific Reports, vol. 5(1), Nov. 3, 2015, 8 pages.
Extended European Search Report for European Application No. 19 895 265.7, dated Feb. 4, 2022, 10 pages.
Chigane et al., "Preparation of Hollow Titanium Dioxide Shell Thin Films by Electrophoresis and Electrolysis for Dye-Sensitized Solar Cells", Electrochemical and State Letters, 12(5) E5-E8, (2009).

(Continued)

*Primary Examiner* — Angelo Trivisonno
(74) *Attorney, Agent, or Firm* — RATNERPRESTIA

(57) ABSTRACT

Provided is a novel method for producing a laminate that serves as an electron transport layer and an optically transparent electrode layer of a perovskite solar cell having, in the following order, an optically transparent electrode layer, an electron transport layer, a perovskite crystal layer, a hole transport layer, and a current collecting layer. The method involves forming a titanium oxide layer that serves as the electron transport layer on a member that serves as the optically transparent electrode layer by utilizing said member for cathode polarization in a treatment liquid containing a Ti component.

17 Claims, No Drawings

(56) References Cited

OTHER PUBLICATIONS

Chigane et al., "Titanium Dioxide Thin Films Prepared by Electrolysis from Aqueous Solution of Titanium-lactic Acid Complex for Dye-sensitized Solar Cells", Thin Solid Films, 2012, pp. 3510-3514.
International Search Report and Written Opinion for International Application No. PCT/JP2019/047996, dated Feb. 10, 2020, 7 pages.
Japanese Office Action, with Concise Statement of Relevance, for Japanese Application No. 2020-517229, dated Feb. 2, 2021, 5 pages.
Taiwanese Office Action, with Concise Statement of Relevance, for Taiwanese Application No. 108145356, dated Aug. 10, 2020, 7 pages.
Non Final Office Action for U.S. Appl. No. 17/294,823, dated Aug. 15, 2022, 27 pages.
Korean Office Action for Korean Application No. 10-2021-7016993, dated Jan. 17, 2023 with Concise Statement of Relevance of Office Action, 7 pages.

\* cited by examiner

METHOD FOR PRODUCING LAMINATE AND METHOD FOR PRODUCING PEROVSKITE SOLAR CELL

CROSS REFERENCE TO RELATED APPLICATIONS

This is the U.S. National Phase application of PCT/JP2019/047996, filed Dec. 9, 2019, which claims priority to Japanese Patent Application No. 2018-232670, filed Dec. 12, 2018, the disclosures of these applications being incorporated herein by reference in their entireties for all purposes.

FIELD OF THE INVENTION

The present invention relates to a laminate producing method and a perovskite solar cell producing method.

BACKGROUND OF THE INVENTION

Conventionally, a perovskite solar cell is known (see Patent Literature 1).

A perovskite solar cell includes, for instance, a light-transmissive electrode layer, an electron transport layer, a perovskite crystal layer, a hole transport layer and a collector electrode layer in this order.

PATENT LITERATURE

Patent Literature 1: JP 2015-56430 A

SUMMARY OF THE INVENTION

As described above, a perovskite solar cell includes, for instance, a light-transmissive electrode layer, an electron transport layer, a perovskite crystal layer, a hole transport layer and a collector electrode layer in this order.

An object according to aspects of the present invention is to provide a new method for producing a laminate that serves as a light-transmissive electrode layer and an electron transport layer of such a perovskite solar cell.

The present inventors have made an intensive study and as a result found that when the configuration described below is employed, the foregoing object is achieved. Aspects of the invention have been thus completed.

Specifically, aspects of the present invention provide the following [1] to [5].

[1] A laminate producing method for producing a laminate serving as a light-transmissive electrode layer and an electron transport layer of a perovskite solar cell including the light-transmissive electrode layer, the electron transport layer, a perovskite crystal layer, a hole transport layer and a collector electrode layer in this order, the method comprising:

subjecting a member serving as the light-transmissive electrode layer to cathode polarization in a treatment solution containing a Ti component to thereby form, on the member, a titanium oxide layer serving as the electron transport layer.

[2] The laminate producing method according to [1] above, wherein a Ti content of the treatment solution is not less than 0.004 mol/L and not more than 1.300 mol/L.

[3] The laminate producing method according to [1] or [2] above, wherein the Ti component is at least one selected from the group consisting of hexafluorotitanic acid, potassium hexafluorotitanate, sodium hexafluorotitanate, ammonium hexafluorotitanate, ammonium titanyl oxalate, potassium titanyl oxalate dihydrate, titanium sulfate, and titanium lactate.

[4] The laminate producing method according to any one of [1] to [3] above, wherein current is applied at a current density of not less than 0.01 A/dm$^2$ and less than 1.00 A/dm$^2$ with the member serving as the light-transmissive electrode layer being used as a cathode.

[5] A perovskite solar cell producing method for producing a perovskite solar cell including a light-transmissive electrode layer, an electron transport layer, a perovskite crystal layer, a hole transport layer and a collector electrode layer in this order by using a laminate obtained by the laminate producing method according to any one of [1] to [4] above.

Aspects of the present invention make it possible to provide a new method for producing a laminate that serves as a light-transmissive electrode layer and an electron transport layer of a perovskite solar cell.

DETAILED DESCRIPTION OF EMBODIMENTS

Perovskite Solar Cell

First, a perovskite solar cell is described.

A perovskite solar cell includes, for instance, a light-transmissive electrode layer, an electron transport layer, a perovskite crystal layer, a hole transport layer and a collector electrode layer in this order.

The thickness and the like of each layer are appropriately specified.

An example of the light-transmissive electrode layer is a conductive metal oxide film such as an ITO (Indium Tin Oxide) film or an FTO (Fluorine-doped Tin Oxide) film. The light-transmissive electrode layer may be disposed on a transparent substrate such as a glass substrate or a resin film.

An example of the electron transport layer is a titanium oxide layer containing titanium oxide ($TiO_2$) that is an n-type semiconductor.

An example of the perovskite crystal layer is, for example, a layer containing a 1 to 4 substituted or unsubstituted ammonium metal halide doped with metal ions.

For a metal forming the 1 to 4 substituted or unsubstituted ammonium metal halide, for example, metals belonging to Groups 11 to 15 of the periodic table are applicable for the reasons that they can develop the perovskite structure and doping is possible. Lead, indium, zinc, tin, silver, antimony and copper are preferred, lead and tin are more preferred, and lead is even more preferred.

As a halogen forming the 1 to 4 substituted or unsubstituted ammonium metal halide, iodine, chlorine and bromine are preferred, and iodine is more preferred.

Examples of the 1 to 4 substituted or unsubstituted ammonium metal halide as above include 1 substituted ammonium lead halides such as $(CH_3NH_3)PbI_3$, $(C_6H_5C_2H_4NH_3)_2PbI_4$, $(C_{10}H_7CH_2NH_3)_2PbI_4$, and $(C_6H_{13}NH_3)_2PbI_4$, with preferred being $(CH_3NH_3)PbI_3$.

For the metal ions with which the 1 to 4 substituted or unsubstituted ammonium metal halide is doped, examples include ions of metals belonging to Groups 11 to 15 of the periodic table, with preferred being indium ions, zinc ions, tin ions, silver ions, antimony ions, copper ions and the like, and more preferred being indium ions, antimony ions and the like.

The amount of doping of metal is preferably 0.01 to 0.5 mol and more preferably 0.05 to 0.2 mol based on 1 mol of the metal forming the 1 to 4 substituted or unsubstituted ammonium metal halide.

Examples of an ingredient of the hole transport layer include: iodides such as copper iodide (CuI); cobalt complexes such as layered cobalt oxides; CuSCN; molybdenum oxides; nickel oxides; $4CuBr \cdot C_4H_9$); and organic hole transport materials.

Examples of the collector electrode layer include an Au electrode layer, an Ag electrode layer, an Al electrode layer, and a Ca electrode layer, and of these, an Au electrode layer is preferred.

Laminate Producing Method

Roughly speaking, a laminate producing method according to aspects of the invention is a method for producing a laminate that serves as the light-transmissive electrode layer and the electron transport layer of the perovskite solar cell described above.

To be more specific, a member serving as the light-transmissive electrode layer is subjected to cathode polarization in a treatment solution containing a Ti component. That is, current is applied with the member serving as the light-transmissive electrode layer being used as the cathode. Consequently, a titanium oxide layer serving as the electron transport layer is formed on the member serving as the light-transmissive electrode layer. For the counter electrode, an insoluble electrode such as a platinum electrode is suitable.

It is presumed that the titanium oxide layer is formed as follows. First, upon generation of hydrogen, the pH increases at the surface of the member serving as the light-transmissive electrode layer. As a result, when the Ti component in the treatment solution is hexafluorotitanic acid and/or its salt for instance, hexafluorotitanic acid ions in the treatment solution generate titanium hydroxide while being defluorinated. This titanium hydroxide adheres to the surface of the member serving as the light-transmissive electrode layer, and through subsequent washing and dehydration condensation by drying or the like, the titanium oxide layer is formed. However, any other mechanisms than the foregoing are also regarded as being within the scope according to aspects of the invention.

The member serving as the light-transmissive electrode layer is preferably a member having electrical conductivity, e.g., a conductive metal oxide film such as an ITO film or an FTO film.

The member serving as the light-transmissive electrode layer may be disposed on a transparent substrate such as a glass substrate or a resin film. In this case, the transparent substrate having the member serving as the light-transmissive electrode layer (e.g., an FTO film-bearing glass substrate) is subjected to cathode polarization. In this case, the resulting laminate is to include this transparent substrate.

The treatment solution contains a Ti component (Ti compound) for supplying Ti (elemental titanium) to the titanium oxide layer to be formed.

As the Ti component, preferred is at least one selected from the group consisting of hexafluorotitanic acid ($H_2TiF_6$), potassium hexafluorotitanate ($K_2TiF_6$), sodium hexafluorotitanate ($Na_2TiF_6$), ammonium hexafluorotitanate (($NH_4$)$_2TiF_6$), ammonium titanyl oxalate (($NH_4$)$_2$[TiO($C_2O_4$)$_2$]), potassium titanyl oxalate dihydrate ($K_2$[TiO($C_2O_4$)$_2$]$\cdot 2H_2O$). titanium sulfate (Ti($SO_4$)$_2$), and titanium lactate (Ti(OH)$_2$[OCH(CH$_3$)COOH]$_2$).

Of these, hexafluorotitanic acid and/or its salts (potassium hexafluorotitanate, sodium hexafluorotitanate, ammonium hexafluorotitanate) are preferred for the sake of stability of the treatment solution, availability, and other factors.

The Ti content of the treatment solution is preferably not less than 0.004 mol/L, more preferably not less than 0.010 mol/L, and even more preferably not less than 0.020 mol/L.

At the same time, the Ti content of the treatment solution is preferably not more than 1.300 mol/L, more preferably not more than 1.000 mol/L, even more preferably not more than 0.700 mol/L, particularly preferably not more than 0.300 mol/L, and most preferably not more than 0.150 mol/L.

Water is used as a solvent of the treatment solution.

The pH of the treatment solution is not particularly limited and is for example 2.0 to 5.0. Known acid components (e.g., phosphoric acid, sulfuric acid) or alkaline components (e.g., sodium hydroxide, ammonia water) may be used for pH adjustment.

The treatment solution may optionally contain a surfactant such as sodium lauryl sulfate or acetylenic glycol. The treatment solution may also contain condensed phosphate such as pyrophosphate for the sake of stability of deposition behavior over time.

The treatment solution has a temperature preferably of 20° C. to 80° C. and more preferably of 40° C. to 60° C.

The treatment solution may further contain a conduction aid.

Exemplary conduction aids include: sulfates such as potassium sulfate, sodium sulfate, magnesium sulfate and calcium sulfate; nitrates such as potassium nitrate, sodium nitrate, magnesium nitrate and calcium nitrate; and chloride salts such as potassium chloride, sodium chloride, magnesium chloride and calcium chloride.

The conduction aid content of the treatment solution is preferably 0.010 to 1.000 mol/L and more preferably 0.020 to 0.500 mol/L.

The current density during cathode polarization is preferably not less than 0.01 A/dm$^2$, more preferably not less than 0.10 A/dm$^2$, and even more preferably not less than 0.20 A/dm$^2$.

At the same time, the current density during cathode polarization is preferably less than 1.00 A/dm$^2$, more preferably not more than 0.80 A/dm$^2$, and even more preferably not more than 0.60 A/dm$^2$.

The current application time is suitably specified and is for example 5 to 60 seconds and preferably 10 to 40 seconds.

Cathode polarization may be followed by washing with water.

The washing method is not particularly limited, and one exemplary method is immersion in water after cathode polarization. The temperature of water (water temperature) for use in washing is preferably 40° C. to 90° C.

The washing time is preferably more than 0.5 seconds and preferably 1.0 to 5.0 seconds.

Further, drying may replace or follow the washing with water. The temperature and the method of drying are not particularly limited, and a drying process using a typical drier or electric furnace may be employed for example. The drying temperature is preferably not higher than 100° C.

Perovskite Solar Cell Producing Method

A perovskite solar cell producing method according to aspects of the invention is a method for producing a perovskite solar cell including a light-transmissive electrode layer, an electron transport layer, a perovskite crystal layer, a hole transport layer and a collector electrode layer in this order by using the laminate obtained by the laminate producing method according to aspects of the invention described above.

For instance, layers serving as the perovskite crystal layer, the hole transport layer and the collector electrode layer are sequentially formed on a titanium oxide layer serving as the electron transport layer in the laminate obtained by the laminate producing method according to aspects of the invention.

When the perovskite crystal layer is for instance a layer containing In ion-doped ($CH_3NH_3$)$PbI_3$, first, a mixed solution obtained by mixing $PbI_2$ and $InCl_3$ such that the molar ratio between Pb and In leads to a desired amount of doping is applied onto the titanium oxide layer serving as the electron transport layer by spin coating or another process to form a film, and then dried. Next, the resultant is immersed in a $CH_3NH_3I$ solution and dried. Examples of solvents of the mixed solution and the solution include polar solvents such as γ-butyrolactone, N-methyl-2-pyrrolidone, N,N-dimethylformamide, and isopropanol. The temperature, the time and the like of drying and immersion are appropriately specified.

The hole transport layer is formed by, for example, repeating an operation in which a solution of an ingredient of the hole transport layer is dropped onto the perovskite crystal layer and the surface is leveled. Examples of a solvent of the solution include organic solvents such as n-propyl sulfide.

The collector electrode layer is formed by, for example, vapor-depositing metal such as Au onto the hole transport layer.

The methods for forming the respective layers are not limited to the foregoing methods, and known methods may be suitably used.

EXAMPLE

Aspects of the present invention are specifically described below with reference to an example. However, the present invention is not limited thereto.

Preparation of Member Serving as Light-transmissive Electrode Layer

Prepared was an FTO film-bearing glass substrate (manufactured by Ideal Star Inc.) having an FTO (Fluorine-doped Tin Oxide) film laminated on one surface of a glass substrate (30 mm×35 mm, thickness: 0.7 mm) by sputtering. This FTO film-bearing glass substrate was used as a transparent substrate having a member serving as the light-transmissive electrode layer.

Production of Laminate Serving as Light-transmissive Electrode Layer and Electron Transport Layer A laminate serving as the light-transmissive electrode layer and the electron transport layer was produced using the prepared FTO film-bearing glass substrate (the transparent substrate having the member serving as the light-transmissive electrode layer) in the following manner.

First, prepared was a treatment solution containing 0.040 mol/L of potassium hexafluorotitanate ($K_2TiF_6$) and 0.10 mol/L of potassium sulfate ($K_2SO_4$) and having the pH adjusted to 4.0 by use of potassium hydroxide (hereinafter simply called "treatment solution").

Next, the prepared FTO film-bearing glass substrate was immersed in a cleaning solution having Semiclean M-4 (manufactured by Yokohama Oils & Fats Industry Co., Ltd.) diluted by 20 times with ion exchanged water, and subjected to ultrasonic cleaning for 10 minutes. Thereafter, the FTO film-bearing glass substrate was taken out from the cleaning solution, immersed in ion exchanged water, and subjected to ultrasonic cleaning for 10 minutes.

The cleaned FTO film-bearing glass substrate was immersed in the prepared treatment solution (solution temperature: 50° C.). The FTO film-bearing glass substrate was subjected to cathode polarization in the treatment solution under the conditions of a current density of 0.40 A/dm$^2$ and a current application time of 20 seconds. Then, the FTO film-bearing glass substrate was immersed in a water bath at 25° C. for 2.0 seconds for washing with water, and then dried by a blower at room temperature. Thus, a titanium oxide layer serving as the electron transport layer with a thickness of about 50 nm was formed on the FTO film of the FTO film-bearing glass substrate. The FTO film-bearing glass substrate having the titanium oxide layer formed thereon (a laminate serving as the light-transmissive electrode layer and the electron transport layer) was produced in this manner.

Production of Perovskite Solar Cell

A perovskite solar cell was produced using the produced laminate, as follows.

<<Formation of Perovskite Crystal Layer>>

First, prepared was a $PbI_2$—$InCl_3$ mixed solution with the Pb concentration adjusted to 0.9 mol/L and the In concentration adjusted to 0.1 mol/L. Further, 10 mg/mg of isopropanol solution of $CH_3NH_3I$ was prepared.

The prepared $PbI_2$—$InCl_3$ mixed solution was spin-coated onto the FTO film-bearing glass substrate having the titanium oxide layer formed thereon at room temperature to form a film, heated and dried at 70° C. for 30 minutes, and allowed to cool. Thus, an In-doped $PbI_3$ layer was formed. This was immersed in the prepared isopropanol solution of $CH_3NH_3I$ at room temperature for 20 seconds, and immediately afterwards immersed in isopropanol for 1 minute for rinsing. Then, an excess solution was removed with a spin coater. The resultant was subsequently heated and dried at 70° C. for 30 minutes and allowed to cool, whereafter an excess solution was removed with an air spray gun. Thus, an In-doped ($CH_3NH_3$)$PbI_3$ layer (perovskite crystal layer) was formed on the titanium oxide layer.

<<Formation of Hole Transport Layer>>

The FTO film-bearing glass substrate having the In-doped ($CH_3NH_3$)$PbI_3$ layer and the titanium oxide layer formed thereon was placed on a hot plate at 65° C. In this state, an operation in which a drop of an n-propyl sulfide solution with a CuSCN concentration of 0.05 mol/L was dropped onto the In-doped ($CH_3NH_3$)$PbI_3$ layer and the surface was leveled with a glass rod was repeated 30 times to thereby form a CuSCN layer (hole transport layer) with a thickness of 0.5 to 2 μm.

<<Formation of Collector Electrode Layer>>

An Au electrode layer (collector electrode layer) was formed on the CuSCN layer (hole transport layer) by vapor deposition. More specifically, a shadow mask corresponding to an electrode shape and the glass substrate on which the layers up to the hole transport layer had been formed were placed in a chamber. A gold wire was subjected to resistance heating in the chamber with reduced pressure to form, via the shadow mask, a film of gold on the hole transport layer.

Thus, a perovskite solar cell in which the FTO film (light-transmissive electrode layer), the titanium oxide layer (electron transport layer), the In-doped $(CH_3NH_3)PbI_3$ layer (perovskite crystal layer), the CuSCN layer (hole transport layer), and the Au electrode layer (collector electrode layer) were stacked in this order on one surface of the glass substrate, was produced.

Evaluation of Perovskite Solar Cell

The following evaluation was conducted with the produced perovskite solar cell.

The perovskite solar cell was irradiated, from its FTO film side, with artificial sunlight having a spectrum distribution of AM 1.5G and a light intensity of 100 mW/cm$^2$ by use of a solar simulator (XES-502S, manufactured by SAN-EI Electric Co., Ltd.). In this state, a photocurrent-voltage profile of the perovskite solar cell was measured with a linear sweep voltammetry (LSV) measurement device (HZ-5000, manufactured by Hokuto Denko Corporation).

From this profile, those values were calculated: short-circuit current (absolute value, Jsc): 8.39 mA/cm$^2$, open-circuit voltage (Voc): 0.540 V, fill factor (FF): 0.57, and power conversion efficiency (PCE): 2.59%.

The invention claimed is:

1. A laminate producing method for producing a laminate serving as a light-transmissive electrode layer and an electron transport layer of a perovskite solar cell including the light-transmissive electrode layer, the electron transport layer, a perovskite crystal layer, a hole transport layer and a collector electrode layer in this order, the method comprising:
subjecting a member serving as the light-transmissive electrode layer to cathode polarization in an acidic treatment solution containing a Ti component to thereby form, directly on a surface of the member serving as the light-transmissive electrode layer, a titanium oxide layer serving as the electron transport layer,
wherein polystyrene sphere particles are not adsorbed on the member serving as the light-transmissive electrode layer before subjecting the member serving as the light-transmissive electrode layer to cathode polarization.

2. The laminate producing method according to claim 1, wherein a Ti content of the treatment solution is not less than 0.004 and not more than 1.300 mol/L.

3. The laminate producing method according to claim 1, wherein the Ti component is at least one selected from the group consisting of hexafluorotitanic acid, potassium hexafluorotitanate, sodium hexafluorotitanate, ammonium hexafluorotitanate, ammonium titanyl oxalate, potassium titanyl oxalate dihydrate, titanium sulfate, and titanium lactate.

4. The laminate producing method according to claim 2, wherein the Ti component is at least one selected from the group consisting of hexafluorotitanic add, potassium hexafluorotitanate, sodium hexafluorotitanate, ammonium hexafluorotitanate, ammonium titanyl oxalate, potassium titanyl oxalate dihydrate, titanium sulfate, and titanium lactate.

5. The laminate producing method according to claim 1, wherein current is applied at a current density of not less than 0.01 A/dm$^2$ and less than 1.00 A/dm$^2$ with the member serving as the light-transmissive electrode layer being used as a cathode.

6. The laminate producing method according to claim 2, wherein current is applied at a current density of not less than 0.01 A/dm$^2$ and less than 1.00 A/dm$^2$ with the member serving as the light-transmissive electrode layer being used as a cathode.

7. The laminate producing method according to claim 3, wherein current is applied at a current density of not less than 0.01 A/dm$^2$ and less than 1.00 A/dm$^2$ with the member serving as the light-transmissive electrode layer being used as a cathode.

8. The laminate producing method according to claim 4, wherein current is applied at a current density of not less than 0.01 A/dm$^2$ and less than 1.00 A/dm$^2$ with the member serving as the light-transmissive electrode layer being used as a cathode.

9. A perovskite solar cell producing method for producing a perovskite solar cell including a light-transmissive electrode layer, an electron transport layer, a perovskite crystal layer, a hole transport layer and a collector electrode layer in this order by using a laminate obtained by the laminate producing method according to claim 1.

10. A perovskite solar cell producing method for producing a perovskite solar cell including a light-transmissive electrode layer, an electron transport layer, a perovskite crystal layer, a hole transport layer and a collector electrode layer in this order by using a laminate obtained by the laminate producing method according to claim 2.

11. A perovskite solar cell producing method for producing a perovskite solar cell including a light-transmissive electrode layer, an electron transport layer, a perovskite crystal layer, a hole transport layer and a collector electrode layer in this order by using a laminate obtained by the laminate producing method according to claim 3.

12. A perovskite solar cell producing method for producing a perovskite solar cell including a light-transmissive electrode layer, an electron transport layer, a perovskite crystal layer, a hole transport layer and a collector electrode layer in this order by using a laminate obtained by the laminate producing method according to claim 4.

13. A perovskite solar cell producing method for producing a perovskite solar cell including a light-transmissive electrode layer, an electron transport layer, a perovskite crystal layer, a hole transport layer and a collector electrode layer in this order by using a laminate obtained by the laminate producing method according to claim 5.

14. A perovskite solar cell producing method for producing a perovskite solar cell including a light-transmissive electrode layer, an electron transport layer, a perovskite crystal layer, a hole transport layer and a collector electrode layer in this order by using a laminate obtained by the laminate producing method according to claim 6.

15. A perovskite solar cell producing method for producing a perovskite solar cell including a light-transmissive electrode layer, an electron transport layer, a perovskite crystal layer, a hole transport layer and a collector electrode layer in this order by using a laminate obtained by the laminate producing method according to claim 7.

16. A perovskite solar cell producing method for producing a perovskite solar cell including a light-transmissive electrode layer, an electron transport layer, a perovskite crystal layer, a hole transport layer and a collector electrode layer in this order by using a laminate obtained by the laminate producing method according to claim 8.

17. The laminate producing method according to claim 1, wherein the pH of the treatment solution is in the range of 2.0 to 5.0.

* * * * *

UNITED STATES PATENT AND TRADEMARK OFFICE
CERTIFICATE OF CORRECTION

PATENT NO. : 11,856,807 B2
APPLICATION NO. : 17/297160
DATED : December 26, 2023
INVENTOR(S) : Mikito Suto et al.

It is certified that error appears in the above-identified patent and that said Letters Patent is hereby corrected as shown below:

In the Claims

In Claim 2, Column 7, Line 50 "than 0.004 and not more than 1.300 mol/L." should read -- than 0.004 mol/L and not more than 1.300 mol/L. --

Signed and Sealed this
Thirteenth Day of February, 2024

Katherine Kelly Vidal
*Director of the United States Patent and Trademark Office*